United States Patent
Costa et al.

(10) Patent No.: US 10,068,831 B2
(45) Date of Patent: Sep. 4, 2018

(54) THERMALLY ENHANCED SEMICONDUCTOR PACKAGE AND PROCESS FOR MAKING THE SAME

(71) Applicant: Qorvo US, Inc., Greensboro, NC (US)

(72) Inventors: Julio C. Costa, Oak Ridge, NC (US); Robert Aigner, Apopka, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/491,064

(22) Filed: Apr. 19, 2017

(65) Prior Publication Data

US 2018/0166358 A1    Jun. 14, 2018

Related U.S. Application Data

(60) Provisional application No. 62/431,914, filed on Dec. 9, 2016.

(51) Int. Cl.
*H01L 23/42* (2006.01)
*H01L 23/373* (2006.01)
(Continued)

(52) U.S. Cl.
CPC .......... *H01L 23/42* (2013.01); *H01L 21/563* (2013.01); *H01L 21/568* (2013.01); *H01L 23/3737* (2013.01); *H01L 23/552* (2013.01)

(58) Field of Classification Search
CPC ......... H01L 23/42; H01L 23/34; H01L 23/48; H01L 23/552; H01L 23/532; H01L 23/3737; H01L 23/3192; H01L 23/5329
(Continued)

(56) References Cited

U.S. PATENT DOCUMENTS 4,093,562 A    6/1978   Kishimoto
4,366,202 A    12/1982  Borovsky
(Continued)

FOREIGN PATENT DOCUMENTS

CN    103811474 A    5/2014
EP    2996143 A1     3/2016
(Continued)

OTHER PUBLICATIONS

Applicant-Initiated Interview Summary for U.S. Appl. No. 13/852,648, dated Jan. 27, 2014, 4 pages.
(Continued)

*Primary Examiner* — Chuong A Luu
(74) *Attorney, Agent, or Firm* — Withrow & Terranova, P.L.L.C.

(57) ABSTRACT

The present disclosure relates to a thermally enhanced semiconductor package, which includes a module substrate, a thinned flip chip die over the module substrate, a mold compound component, a thermally conductive film, and a thermally enhanced mold compound component. The mold compound component resides over the module substrate, surrounds the thinned flip chip die, and extends above an upper surface of the thinned flip chip die to form a cavity over the upper surface of the thinned flip chip die. The thermally conductive film resides over at least the upper surface of the thinned flip chip at the bottom of the cavity. The thermally enhanced mold compound component resides over at least a portion of the thermally conductive film to fill the cavity.

16 Claims, 9 Drawing Sheets

(51) Int. Cl.
 *H01L 23/552* (2006.01)
 *H01L 21/56* (2006.01)
(58) Field of Classification Search
 USPC ......................................................... 257/659
 See application file for complete search history.

(56) References Cited

U.S. PATENT DOCUMENTS

| | | | |
|---|---|---|---|
| 5,061,663 A | 10/1991 | Bolt et al. | |
| 5,069,626 A | 12/1991 | Patterson et al. | |
| 5,391,257 A | 2/1995 | Sullivan et al. | |
| 5,459,368 A | 10/1995 | Onishi et al. | |
| 5,646,432 A | 7/1997 | Iwaki et al. | |
| 5,648,013 A | 7/1997 | Uchida et al. | |
| 5,699,027 A | 12/1997 | Tsuji et al. | |
| 5,709,960 A | 1/1998 | Mays et al. | |
| 5,831,369 A | 11/1998 | Fürbacher et al. | |
| 5,920,142 A | 7/1999 | Onishi et al. | |
| 6,072,557 A | 6/2000 | Kishimoto | |
| 6,084,284 A | 7/2000 | Adamic, Jr. | |
| 6,154,366 A | 11/2000 | Ma et al. | |
| 6,154,372 A | 11/2000 | Kalivas et al. | |
| 6,235,554 B1 | 5/2001 | Akram et al. | |
| 6,236,061 B1 | 5/2001 | Walpita | |
| 6,268,654 B1 | 7/2001 | Glenn et al. | |
| 6,271,469 B1 | 8/2001 | Ma et al. | |
| 6,423,570 B1 | 7/2002 | Ma et al. | |
| 6,426,559 B1 | 7/2002 | Bryan et al. | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,713,859 B1 | 3/2004 | Ma | |
| 6,841,413 B2 | 1/2005 | Liu et al. | |
| 6,864,156 B1 | 3/2005 | Conn | |
| 6,902,950 B2 | 6/2005 | Ma et al. | |
| 6,943,429 B1 | 9/2005 | Glenn et al. | |
| 6,964,889 B2 | 11/2005 | Ma et al. | |
| 6,992,400 B2 | 1/2006 | Tikka et al. | |
| 7,042,072 B1 | 5/2006 | Kim et al. | |
| 7,049,692 B2 | 5/2006 | Nishimura et al. | |
| 7,109,635 B1 | 9/2006 | McClure et al. | |
| 7,183,172 B2 | 2/2007 | Lee et al. | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,427,824 B2 | 9/2008 | Iwamoto et al. | |
| 7,596,849 B1 | 10/2009 | Carpenter et al. | |
| 7,619,347 B1 | 11/2009 | Bhattacharjee | |
| 7,635,636 B2 | 12/2009 | McClure et al. | |
| 7,714,535 B2 | 5/2010 | Yamazaki et al. | |
| 7,749,882 B2 | 7/2010 | Kweon et al. | |
| 7,790,543 B2 | 9/2010 | Abadeer et al. | |
| 7,855,101 B2 | 12/2010 | Furman et al. | |
| 7,868,419 B1 | 1/2011 | Kerr et al. | |
| 7,960,218 B2 | 6/2011 | Ma et al. | |
| 8,183,151 B2 | 5/2012 | Lake | |
| 8,420,447 B2 | 4/2013 | Tay et al. | |
| 8,503,186 B2 | 8/2013 | Lin et al. | |
| 8,643,148 B2 | 2/2014 | Lin et al. | |
| 8,664,044 B2 | 3/2014 | Jin et al. | |
| 8,772,853 B2 | 7/2014 | Hong et al. | |
| 8,791,532 B2 | 7/2014 | Graf et al. | |
| 8,802,495 B2 | 8/2014 | Kim et al. | |
| 8,816,407 B2 | 8/2014 | Kim et al. | |
| 8,835,978 B2 | 9/2014 | Mauder et al. | |
| 8,906,755 B1 | 12/2014 | Hekmatshoartabari et al. | |
| 8,921,990 B2 | 12/2014 | Park et al. | |
| 8,927,968 B2 | 1/2015 | Cohen et al. | |
| 8,941,248 B2 | 1/2015 | Lin et al. | |
| 8,963,321 B2 | 2/2015 | Lenniger et al. | |
| 9,165,793 B1 | 10/2015 | Wang et al. | |
| 9,368,429 B2 | 6/2016 | Ma et al. | |
| 9,461,001 B1 | 10/2016 | Tsai et al. | |
| 9,646,856 B2 | 5/2017 | Meyer et al. | |
| 9,859,254 B1 | 1/2018 | Yu et al. | |
| 9,941,245 B2 | 4/2018 | Skeete et al. | |
| 2001/0004131 A1 | 6/2001 | Masayuki et al. | |
| 2002/0070443 A1 | 6/2002 | Mu et al. | |
| 2002/0074641 A1 | 6/2002 | Towle et al. | |
| 2002/0127769 A1 | 9/2002 | Ma et al. | |
| 2002/0127780 A1 | 9/2002 | Ma et al. | |
| 2002/0137263 A1 | 9/2002 | Towle et al. | |
| 2002/0185675 A1 | 12/2002 | Furukawa | |
| 2003/0207515 A1 | 11/2003 | Tan et al. | |
| 2004/0164367 A1 | 8/2004 | Park | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0079686 A1 | 4/2005 | Aigner et al. | |
| 2005/0212419 A1 | 9/2005 | Vazan et al. | |
| 2006/0057782 A1 | 3/2006 | Gardes et al. | |
| 2006/0105496 A1 | 5/2006 | Chen et al. | |
| 2006/0108585 A1 | 5/2006 | Gan et al. | |
| 2006/0261446 A1 | 11/2006 | Wood et al. | |
| 2007/0020807 A1 | 1/2007 | Geefay et al. | |
| 2007/0069393 A1 | 3/2007 | Asahi et al. | |
| 2007/0075317 A1 | 4/2007 | Kato et al. | |
| 2007/0121326 A1 | 5/2007 | Nall et al. | |
| 2007/0158746 A1 | 7/2007 | Ohguro | |
| 2007/0181992 A1 | 8/2007 | Lake | |
| 2007/0190747 A1 | 8/2007 | Humpston et al. | |
| 2007/0252481 A1 | 11/2007 | Iwamoto et al. | |
| 2007/0276092 A1 | 11/2007 | Kanae et al. | |
| 2008/0050852 A1 | 2/2008 | Hwang et al. | |
| 2008/0050901 A1 | 2/2008 | Kweon et al. | |
| 2008/0164528 A1 | 7/2008 | Cohen et al. | |
| 2008/0272497 A1 | 11/2008 | Lake | |
| 2008/0315372 A1 | 12/2008 | Kuan et al. | |
| 2009/0008714 A1 | 1/2009 | Chae | |
| 2009/0010056 A1 | 1/2009 | Kuo et al. | |
| 2009/0014856 A1 | 1/2009 | Knickerbocker | |
| 2009/0179266 A1 | 7/2009 | Abadeer et al. | |
| 2009/0261460 A1* | 10/2009 | Kuan ................... H01L 21/568 257/660 |
| 2010/0012354 A1 | 1/2010 | Hedin et al. | |
| 2010/0029045 A1 | 2/2010 | Ramanathan et al. | |
| 2010/0045145 A1 | 2/2010 | Tsuda | |
| 2010/0081232 A1 | 4/2010 | Furman et al. | |
| 2010/0081237 A1 | 4/2010 | Wong et al. | |
| 2010/0109122 A1 | 5/2010 | Ding et al. | |
| 2010/0127340 A1 | 5/2010 | Sugizaki | |
| 2010/0173436 A1 | 7/2010 | Ouellet et al. | |
| 2010/0200919 A1 | 8/2010 | Kikuchi | |
| 2011/0003433 A1 | 1/2011 | Harayama et al. | |
| 2011/0026232 A1 | 2/2011 | Lin et al. | |
| 2011/0036400 A1 | 2/2011 | Murphy et al. | |
| 2011/0062549 A1 | 3/2011 | Lin | |
| 2011/0068433 A1 | 3/2011 | Kim et al. | |
| 2011/0102002 A1 | 5/2011 | Riehl et al. | |
| 2011/0171792 A1 | 7/2011 | Chang et al. | |
| 2011/0272800 A1 | 11/2011 | Chino | |
| 2011/0272824 A1 | 11/2011 | Pagaila | |
| 2011/0294244 A1 | 12/2011 | Hattori et al. | |
| 2012/0003813 A1 | 1/2012 | Chuang et al. | |
| 2012/0068276 A1 | 3/2012 | Lin et al. | |
| 2012/0094418 A1 | 4/2012 | Grama et al. | |
| 2012/0098074 A1 | 4/2012 | Lin et al. | |
| 2012/0104495 A1 | 5/2012 | Zhu et al. | |
| 2012/0119346 A1 | 5/2012 | Im et al. | |
| 2012/0153393 A1 | 6/2012 | Liang et al. | |
| 2012/0168863 A1 | 7/2012 | Zhu et al. | |
| 2012/0256260 A1 | 10/2012 | Cheng et al. | |
| 2012/0292700 A1 | 11/2012 | Khakifirooz et al. | |
| 2012/0299105 A1 | 11/2012 | Cai et al. | |
| 2013/0001665 A1 | 1/2013 | Zhu et al. | |
| 2013/0015429 A1 | 1/2013 | Hong et al. | |
| 2013/0049205 A1 | 2/2013 | Meyer et al. | |
| 2013/0099315 A1 | 4/2013 | Zhu et al. | |
| 2013/0105966 A1 | 5/2013 | Kelkar et al. | |
| 2013/0147009 A1 | 6/2013 | Kim | |
| 2013/0155681 A1 | 6/2013 | Nall et al. | |
| 2013/0196483 A1 | 8/2013 | Dennard et al. | |
| 2013/0200456 A1 | 8/2013 | Zhu et al. | |
| 2013/0280826 A1 | 10/2013 | Scanlan et al. | |

(56) References Cited

U.S. PATENT DOCUMENTS

| | | | |
|---|---|---|---|
| 2013/0299871 | A1 | 11/2013 | Mauder et al. |
| 2014/0035129 | A1 | 2/2014 | Stuber et al. |
| 2014/0134803 | A1 | 5/2014 | Kelly et al. |
| 2014/0168014 | A1 | 6/2014 | Chih et al. |
| 2014/0197530 | A1 | 7/2014 | Meyer et al. |
| 2014/0210314 | A1 | 7/2014 | Bhattacharjee et al. |
| 2014/0252566 | A1 | 9/2014 | Kerr et al. |
| 2014/0252567 | A1 | 9/2014 | Carroll et al. |
| 2014/0264813 | A1 | 9/2014 | Lin et al. |
| 2014/0264818 | A1 | 9/2014 | Lowe, Jr. et al. |
| 2014/0306324 | A1 | 10/2014 | Costa et al. |
| 2014/0327003 | A1 | 11/2014 | Fuergut et al. |
| 2014/0327150 | A1* | 11/2014 | Jung ..................... H01L 24/96 257/774 |
| 2014/0346573 | A1 | 11/2014 | Adam et al. |
| 2015/0115416 | A1 | 4/2015 | Costa et al. |
| 2015/0130045 | A1 | 5/2015 | Tseng et al. |
| 2015/0235990 | A1 | 8/2015 | Cheng et al. |
| 2015/0235993 | A1 | 8/2015 | Cheng et al. |
| 2015/0243881 | A1 | 8/2015 | Sankman et al. |
| 2015/0255368 | A1 | 9/2015 | Costa |
| 2015/0262844 | A1 | 9/2015 | Meyer et al. |
| 2015/0279789 | A1 | 10/2015 | Mahajan et al. |
| 2015/0311132 | A1 | 10/2015 | Kuo et al. |
| 2015/0364344 | A1 | 12/2015 | Yu et al. |
| 2015/0380523 | A1 | 12/2015 | Hekmatshoartabari et al. |
| 2016/0002510 | A1 | 1/2016 | Champagne et al. |
| 2016/0079137 | A1 | 3/2016 | Leipold et al. |
| 2016/0093580 | A1 | 3/2016 | Scanlan et al. |
| 2016/0155706 | A1 | 6/2016 | Yoneyama et al. |
| 2016/0284568 | A1 | 9/2016 | Morris et al. |
| 2016/0343592 | A1 | 11/2016 | Costa et al. |
| 2016/0343604 | A1 | 11/2016 | Costa et al. |
| 2017/0190572 | A1 | 7/2017 | Pan et al. |

FOREIGN PATENT DOCUMENTS

| | | | |
|---|---|---|---|
| JP | 2006005025 | A | 1/2006 |
| JP | 2007227439 | A | 9/2007 |
| JP | 2008235490 | A | 10/2008 |
| JP | 2008279567 | A | 11/2008 |
| JP | 2009026880 | A | 2/2009 |
| JP | 2009530823 | A | 8/2009 |
| WO | 2007074651 | A1 | 7/2007 |

OTHER PUBLICATIONS

Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Non-Final Office Action for U.S. Appl. No. 14/715,830, dated Apr. 13, 2016, 16 pages.
Extended European Search Report for European Patent Application No. 15184861.1, dated Jan. 25, 2016, 6 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
Final Office Action for U.S. Appl. No. 13/852,648, dated Jul. 20, 2016, 14 pages.
Notice of Allowance for U.S. Appl. No. 14/529,870, dated Jul. 15, 2016, 8 pages.
Office Action of the Intellectual Property Office for Taiwanese Patent Application No. 104130224, dated Jun. 15, 2016, 9 pages.
Author Unknown, "Fully Sintered Ferrite Powders," Powder Processing and Technology, LLC, Date Unknown, 1 page.
Author Unknown, "Hysol UF3808," Henkel Corporation, Technical Data Sheet, May 2013, 2 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Non-Final Office Action for U.S. Appl. No. 14/851,652, dated Oct. 7, 2016, 10 pages.
Notice of Allowance for U.S. Appl. No. 14/959,129, dated Oct. 11, 2016, 8 pages.
International Search Report and Written Opinion for PCT/US2016/045809, dated Oct. 7, 2016, 11 pages.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "The Technology: Akhan's Approach and Solution: The Miraj Diamond™ Platform," 2015, accessed Oct. 9, 2016, http://www.akhansemi.com/technology.html#the-miraj-diamond-platform, 5 pages.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Non-Final Office Action for U.S. Appl. No. 15/173,037, dated Jan. 10, 2017, 8 pages.

(56) References Cited

OTHER PUBLICATIONS

Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Ali, K. Ben et al., "RF SOI CMOS Technology on Commercial Trap—Rich High Resistivity SOI Wafer," 2012 IEEE International 801 Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Heat Transfer," Cool Polymers, Inc., 2006, http://www.coolpolymers.com/heattrans.html, 2 pages.
Author Unknown, "Plastics that Conduct Heat," Plastics Technology Online, Jun. 2001, Retrieved Jun. 24, 2013, http://www.ptonline.com/articles/plastics-that-conduct-heat, 4 pages.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.

Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.

(56) References Cited

OTHER PUBLICATIONS

Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, Jean-Pierre et al., "Substrate Crosstalk Reduction Using SOI Technology," IEEE Transactions on Electron Devices, vol. 44, No. 12, Dec. 1997, pp. 2252-2261.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Rong, B., et al., "Surface-Passivated High-Resistivity Silicon Substrates for RFICs," IEEE Electron Device Letters, vol. 25, No. 4, Apr. 2004, pp. 176-178.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Corrected Notice of Allowance for U.S. Appl. No. 14/851,652, dated Sep. 6, 2017, 5 pages.
Notice of Allowance for U.S. Appl. No. 15/229,780, dated Oct. 3, 2017, 7 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Notice of Allowance for U.S. Appl. No. 15/353,346, dated Sep. 25, 2017, 9 pages.
Supplemental Notice of Allowability for U.S. Appl. No. 15/287,273, dated Sep. 7, 2017, 5 pages.
Non-Final Office Action for U.S. Appl. No. 15/652,867, dated Oct. 10, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Non-Final Office Action for U.S. Appl. No. 15/353,346, dated May 23, 2017, 15 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
International Preliminary Report on Patentability for PCT/US2016/045809, dated Feb. 22, 2018, 8 pages.
Non-Final Office Action for U.S. Appl. No. 15/795,915, dated Feb. 23, 2018, 6 pages.
Non-Final Office Action for U.S. Appl. No. 15/387,855, dated Jan. 16, 2018, 7 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Jan. 17, 2018, 5 pages.
Supplemental Notice of Allowability for U.S. Appl. No. 15/287,273, dated Feb. 23, 2018, 5 pages.
Notice of Allowance for U.S. Appl. No. 15/498,040, dated Feb. 20, 2018, 8 pages.
Non-Final Office Action for U.S. Appl. No. 15/676,415, dated Mar. 27, 2018, 14 pages.
Non-Final Office Action for U.S. Appl. No. 15/676,621, dated Mar. 26, 2018, 16 pages.
Bernheim et al., "Chapter 9: Lamination," Tools and Manufacturing Engineers Handbook (book), Apr. 1, 1996, Society of Manufacturing Engineers, p. 9-1.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Final Office Action for U.S. Appl. No. 15/616,109, dated Apr. 19, 2018, 18 pages.
Notice of Allowance for U.S. Appl. No. 15/795,915, dated Jun. 15, 2018, 7 pages.
Non-Final Office Action for U.S. Appl. No. 15/262,457, dated Apr. 19, 2018, 10 pages.
Notice of Allowance for U.S. Appl. No. 15/789,107, dated May 18, 2018, 8 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Non-Final Office Action for U.S. Appl. No. 15/676,693, dated May 3, 2018, 14 pages.
Final Office Action for U.S. Appl. No. 15/387,855, dated May 24, 2018, 9 pages.
Notice of Allowance for U.S. Appl. No. 15/695,629, dated Jul. 11, 2018, 12 pages.

* cited by examiner

THERMALLY ENHANCED SEMICONDUCTOR PACKAGE AND PROCESS FOR MAKING THE SAME

RELATED APPLICATIONS

This application claims the benefit of provisional patent application Ser. No. 62/431,914 filed Dec. 9, 2016 the disclosure of which is hereby incorporated herein by reference in its entirety.

FIELD OF THE DISCLOSURE

The present disclosure relates to a semiconductor package and a process for making the same, and more particularly to a thermally enhanced semiconductor package, and a process to apply a thermally conductive film to the semiconductor package for enhanced thermal performance.

BACKGROUND

With the current popularity of portable communication devices and developed semiconductor fabrication technology, high speed and high performance transistors are more densely integrated on semiconductor dies. Consequently, the amount of heat generated by the semiconductor dies increases significantly due to the large number of transistors integrated on the semiconductor dies, the large amount of power passing through the transistors, and the high operation speed of the transistors. Accordingly, it is desirable to package the semiconductor dies in a configuration for better heat dissipation.

Flip chip assembly technology is widely utilized in semiconductor packaging due to its preferable solder interconnection between flip chip dies and the laminate, on which the flip chip dies are mounted. The flip chip assembly technology eliminates the space needed for wire bonding and the die surface areas of a package, and essentially reduces the overall size of the package. In addition, the elimination of the wire bonding and implementation of a shorter electrical path from the flip chip dies to the laminate reduces undesired inductance and capacitance.

Further, semiconductor dies formed from silicon on insulator (SOI) structures are trending due to the low cost of silicon materials, a large scale capacity of wafer production, well-established semiconductor design tools, and well-established semiconductor manufacturing techniques. However, harmonic generations and low resistivity values of the SOI structures severely limit the SOI's usage in radio-frequency (RF) applications. By using SOI structures in RF fabrications, an interface between the silicon handle layer and an adjacent dielectric layer will generate unwanted harmonic and intermodulation products. Such spectrum degradation causes a number of significant system issues, such as unwanted generation of signals in other RF bands, which the system is attempting to avoid.

To accommodate the increased heat generation of high performance dies and to utilize the advantages of flip chip assembly, it is therefore an object of the present disclosure to provide an improved semiconductor package design with flip chip dies in a configuration for better heat dissipation. In addition, there is also a need to eliminate the deleterious effects of harmonic generations and intermodulation distortions.

SUMMARY

The present disclosure relates to a thermally enhanced semiconductor package, and a process for making the same. According to one embodiment, a thermally enhanced semiconductor package includes a module substrate, a thinned flip chip die over the module substrate, a mold compound component, a thermally conductive film, and a thermally enhanced mold compound component. The thinned flip chip die includes a device layer, a number of interconnects extending from a lower surface of the device layer and coupled to an upper surface of the module substrate, and a dielectric layer over an upper surface of the device layer. The mold compound component resides over the upper surface of the module substrate, surrounds the thinned flip chip die, and extends above an upper surface of the thinned flip chip die to form a cavity over the upper surface of the thinned flip chip die. The thermally conductive film resides over at least the upper surface of the thinned flip chip die at the bottom of the cavity. The thermally enhanced mold compound component resides over at least a portion of the thermally conductive film to fill the cavity.

In one embodiment of the semiconductor package, the thinned flip chip die is formed from a silicon on insulator (SOI) structure. Herein, the device layer of the thinned flip chip die is formed from a silicon epitaxy layer of the SOI structure and the dielectric layer of the thinned flip chip die is a buried oxide layer of the SOI structure.

In one embodiment of the semiconductor package, the thermally conductive film has a higher thermal conductivity than the thermally enhanced mold compound component.

In one embodiment of the semiconductor package, the thermally conductive film has a thermal conductivity between 5 w/m·k and 5000 w/m·k.

In one embodiment of the semiconductor package, the thermally conductive film has a thickness between 0.1 μm to 100 μm.

In one embodiment of the semiconductor package, the thermally conductive film resides over exposed surfaces of the cavity and over the mold compound component to thermally connect the module substrate.

In one embodiment of the semiconductor package, the thermally enhanced mold compound component has a thermal conductivity between 2 w/m·k and 20 w/m·k.

According to an exemplary process, a precursor package including a module substrate, a thinned flip chip die attached to an upper surface of the module substrate, and a mold compound component is provided. Herein, the mold compound component resides over the upper surface of the module substrate, surrounds the thinned flip chip die, and extends above the upper surface of the thinned flip chip die to form a cavity, which is above the upper surface of the thinned flip chip die. Next, a thermally conductive film is deposited over at least the upper surface of the thinned flip chip at the bottom of the cavity. A thermally enhanced mold compound component is then applied over at least a portion of the thermally conductive film to fill the cavity.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
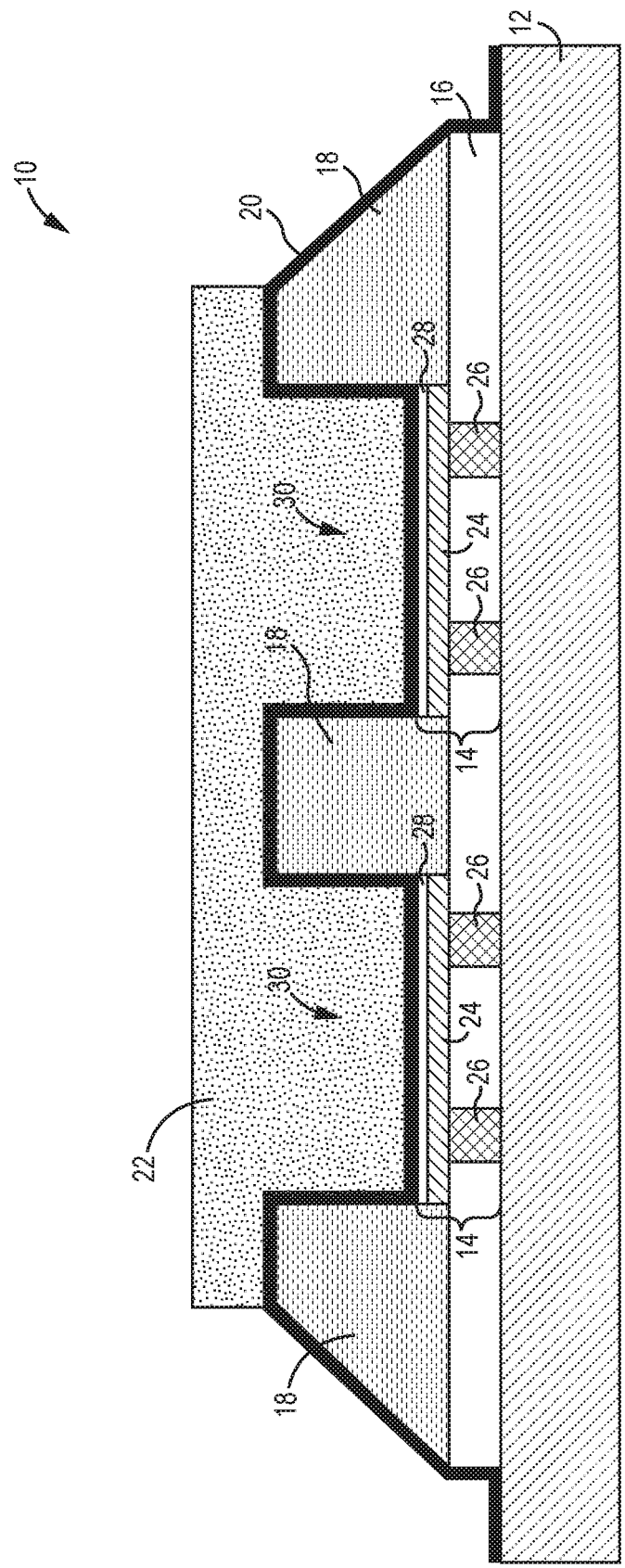
FIG. 1 shows an exemplary thermally enhanced semiconductor package according to one embodiment of the present disclosure.

FIGS. 4-9 provide exemplary steps that illustrate a process to fabricate the exemplary thermally enhanced semiconductor package shown in FIG. 1.

It will be understood that for clear illustrations, FIGS. 1-9 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a thermally enhanced semiconductor package, and a process for making the same. FIG. 1 shows an exemplary thermally enhanced semiconductor package 10 according to one embodiment of the present disclosure. For the purpose of this illustration, the exemplary thermally enhanced semiconductor package 10 includes a module substrate 12, two thinned flip chip dies 14, an underfilling layer 16, a mold compound component 18, a thermally conductive film 20, and a thermally enhanced mold compound component 22. In different applications, the thermally enhanced semiconductor package 10 may include fewer or more thinned flip-chip dies.

In detail, the module substrate 12 may be formed from a laminate, a wafer level fan out (WLFO) carrier, a lead frame, a ceramic carrier, or the like. Each thinned flip chip die 14 includes a device layer 24, a number of interconnects 26 extending from a lower surface of the device layer 24 and coupled to an upper surface of the module substrate 12, a dielectric layer 28 over an upper surface of the device layer 24, and essentially no silicon handle layer (not shown) over the dielectric layer 28. Herein, essentially no silicon handle layer over the dielectric layer 28 refers to at most 2 μm silicon handle layer over the dielectric layer 28. In some cases, the thinned flip chip dies 14 do not include any silicon handle layer such that an upper surface of each thinned flip chip die 14 is an upper surface of the dielectric layer 28. The device layer 24 with a thickness between 10 nm and 20000 nm may be formed of silicon oxide, gallium arsenide, gallium nitride, silicon germanium, or the like, and the dielectric layer 28 with a thickness between 10 nm and 20000 nm may be formed of silicon oxide, silicon nitride, or aluminum nitride. The interconnects 26 with a height between 5 μm and 200 μm may be copper pillar bumps, solder ball bumps, or the like.

In one embodiment, each thinned flip chip die 14 may be formed from a silicon on insulator (SOI) structure, which refers to a structure including a silicon handle layer, a silicon epitaxy layer, and a buried oxide layer sandwiched between the silicon handle layer and the silicon epitaxy layer. Herein, the device layer 24 of each thinned flip chip die 14 is formed by integrating electronic components in or on the silicon epitaxy layer of a SOI structure. The dielectric layer 28 of each thinned flip chip die 14 is the buried oxide layer of the SOI structure. In addition, the silicon handle layer of the SOI structure is removed substantially to complete each thinned flip chip die 14 (more details in the following discussion).

The underfilling layer 16 resides over the upper surface of the module substrate 12, such that the underfilling layer 16 encapsulates the interconnects 26 and underfills each thinned flip chip die 14 between the lower surface of the device layer 24 and the upper surface of the module substrate 12. The underfilling layer 16 may be formed from conventional polymeric compounds, which serve to mitigate the stress effects caused by Coefficient of Thermal Expansion (CTE) mismatch between the thinned flip chip dies 14 and the module substrate 12.

The mold compound component 18 resides over the underfilling layer 16, surrounds each thinned flip chip die 14, and extends above the upper surface of each thinned flip chip die 14 to form a cavity 30 over the upper surface of each thinned flip chip die 14. Herein, the upper surface of each thinned flip chip die 14 is exposed at the bottom of the cavity 30. The mold compound component 18 may be formed from a same or different material as the underfilling layer 16. When the mold compound 18 and the underfilling layer 16 are formed from a same material, the mold compound 18 and the underfilling layer 16 may be formed simultaneously. One exemplary material used to form the mold compound component 18 is an organic epoxy resin system.

The thermally conductive film 20 is continuously deposited over exposed surfaces of each cavity 30 and over the mold compound component 18. In some applications, the thermally conductive film 20 may also extend to thermally connect the module substrate 12. Within each cavity 30, the thermally conductive film 20 is immediately above the upper surface of each thinned flip chip die 14 with no significant voids or defects. Herein, no significant voids or defects refers to no voids or defects larger than 0.1 μm between the thermally conductive film 20 and the upper surface of each thinned flip chip die 14. The thermally conductive film 20 has a high thermal conductivity between 5 w/m·k and 5000 w/m·k and a high electrical resistivity greater than 1E6 Ohm-cm. The thermally conductive film 20 may be formed from chemical vapor deposition (CVD) diamond, aluminum nitride, boron nitride, alumina, beryllium oxide, and the like.

Heat generated by the electronic components in each device layer 24 will travel upward to an area above the upper surface of each thinned flip chip die 14 and then pass laterally in the area above the upper surface of each thinned flip chip die 14 until it is extracted via the interconnects 26 to the module substrate 12. It is therefore highly desirable to have a high thermal conductivity region immediately adjacent to the upper surface of each thinned flip chip die 14 to conduct most of the heat generated by the thinned flip chip dies 14. Consequently, the higher the thermal conductivity in the adjacent region above the upper surface of each thinned flip chip die 14, the better the heat dissipation performance of the thinned flip chip dies 14. Depending on different deposition stresses, different deposited materials, and different applications of the thinned flip chip dies 14, the thermally conductive film 20 has different thicknesses varying from 0.1 μm to 100 μm. For a CVD diamond material, which has an extremely high conductivity greater than 2000 w/m·k, a 1 μm or greater thickness of the thermally conductive film 20 is extremely effective for the heat dissipation management of the thinned flip chip dies 14. For a boron nitride material, which has a high conductivity between 50 w/m·k-100 w/m·k, a 5 μm-10 μm thickness of the thermally conductive film 20 is desirable.

Besides the bottom region of each cavity 30, which is adjacent to the upper surface of each thinned flip chip die 14, the thermally conductive film 20 may also be deposited over the mold compound component 18 and in contact with the module substrate 12. Consequently, the heat generated by the thinned flip chip dies 14 may also dissipate through the thermally conductive film 20 and over the mold compound component 18 to the module substrate 12.

The thermally enhanced mold compound component 22 resides over at least a portion of the thermally conductive film 20 to substantially fill each cavity 30. Although the thermally enhanced mold compound component 22 is not immediately above the thinned flip chip dies 14, the thermally enhanced mold compound component 22 is still close to the thinned flip chip dies 14. Consequently, the thermally enhanced mold compound component 22 is also desired to have a high thermal conductivity and a high electrical resistivity. In this embodiment, the thermally enhanced mold compound component 22 has a lower conductivity than the thermally conductive film 20. The thermally enhanced mold compound component 22 has a thermal conductivity between 2 w/m·k and 20 w/m·k and an electrical resistivity greater than 1E14 Ohm-cm. One exemplary material used to form the thermally enhanced mold compound component 22 is poly phenyl sulfides (PPS) impregnated with boron nitride additives. In addition, the thermally enhanced mold compound component 22 may be formed from a same or different material as the mold compound component 18. However, unlike the thermally enhanced mold compound component 22, the mold compound 18 does not have a thermal conductivity requirement in higher performing embodiments. In some applications, the thermally enhanced mold compound component 22 may further reside over the mold compound component 18.

Figure 2:
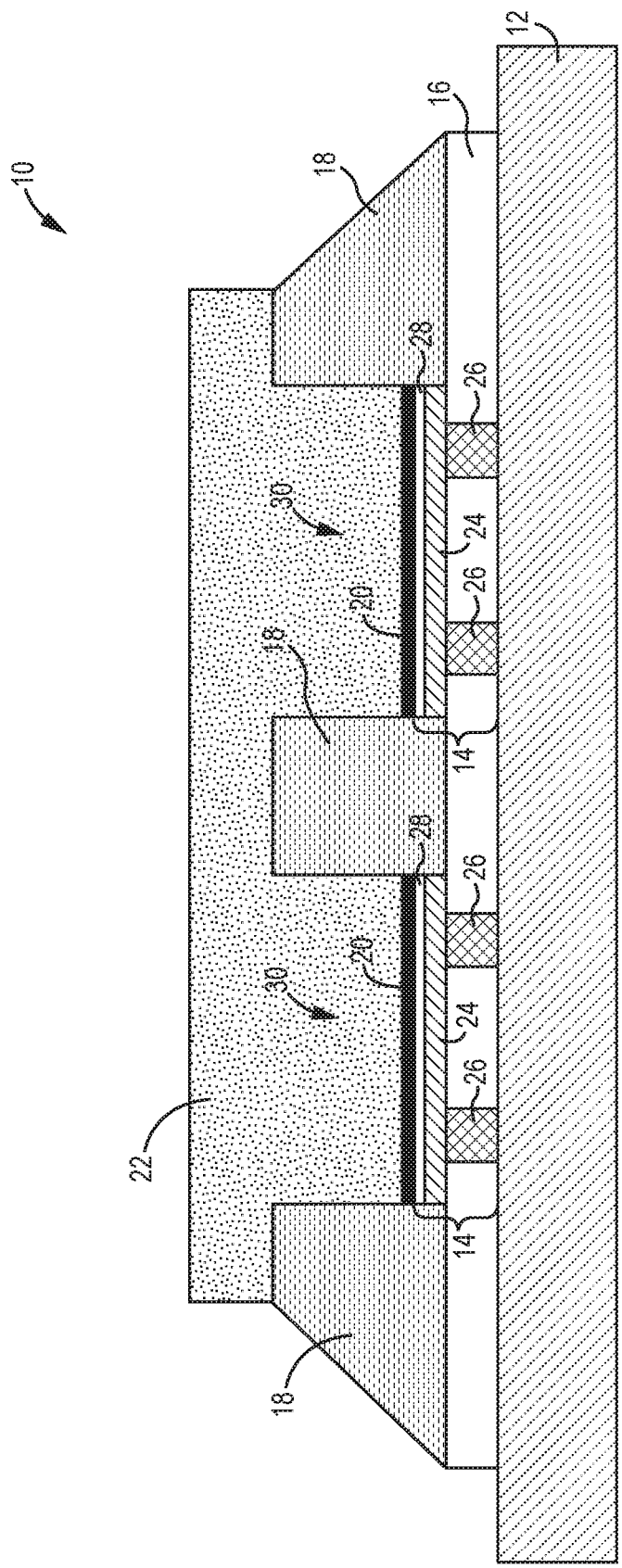
FIG. 2 shows an alternative thermally enhanced semiconductor package according to one embodiment of the present disclosure.

It will be clear to those skilled in the art that the thermally conductive film 20 may only be deposited at the bottom region of each cavity 30, which is adjacent to the upper surface of each thinned flip chip die 14. Herein, the thermally conductive film 20 includes two discrete sections as illustrated in FIG. 2, each of which is immediately above the upper surface of a corresponding thinned flip chip die 14. The thermally enhanced mold compound component 22 resides over each section of the thermally conductive film 20 and fills each cavity 30. In this embodiment, the thermally enhanced mold compound component 22 is in contact with the mold compound component 18.

Figure 3:
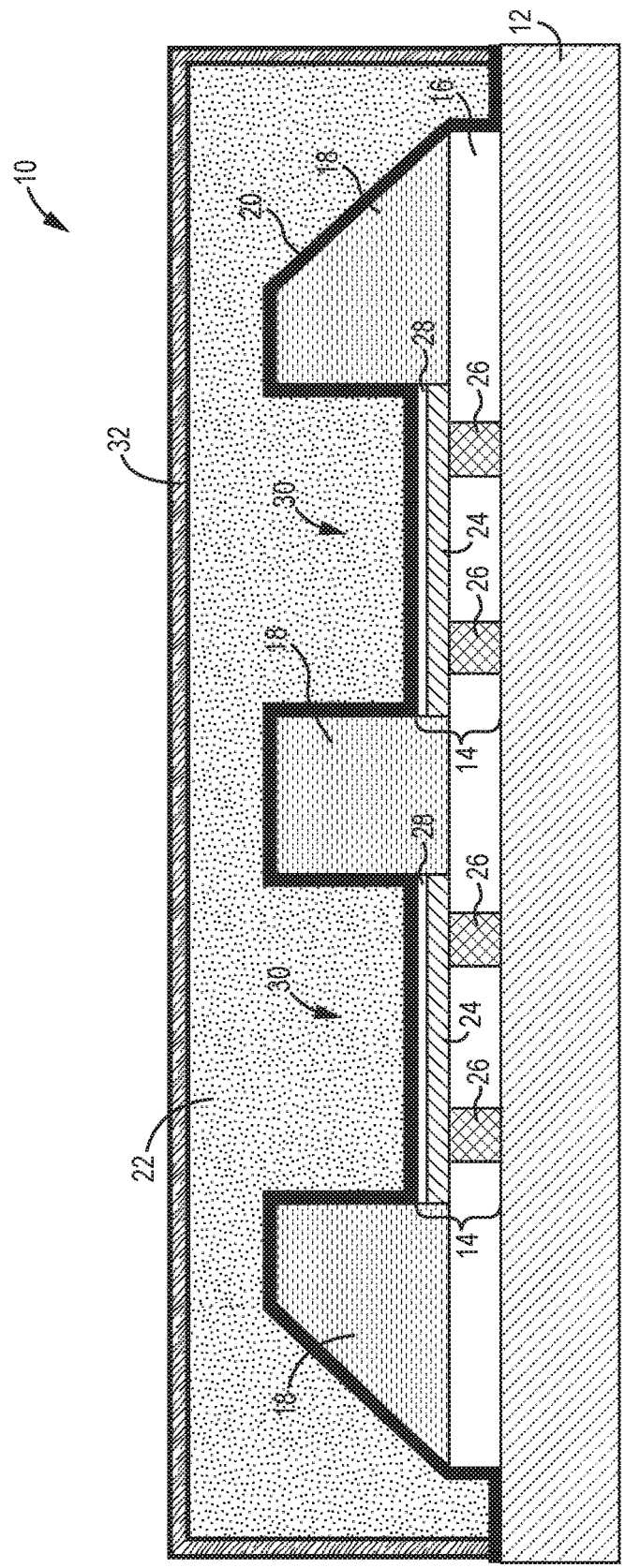
FIG. 3 shows an alternative thermally enhanced semiconductor package according to one embodiment of the present disclosure.

In another embodiment, the thermally enhanced semiconductor package 10 further includes a shielding structure 32 encapsulating the thermally enhanced mold compound component 22 and in contact with the module substrate 12 as illustrated in FIG. 3. Herein, the thermally enhanced mold compound component 22 resides over an entirety of the thermally conductive film 20 so as to provide a planarized surface of the thermally enhanced semiconductor package 10. The shielding structure 32 helps to reduce the electromagnetic interference caused by the thinned flip chip dies 14.

FIGS. 4-9 provide exemplary steps that illustrate a process to fabricate the exemplary thermally enhanced semiconductor package 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 4-9.

Figure 4:
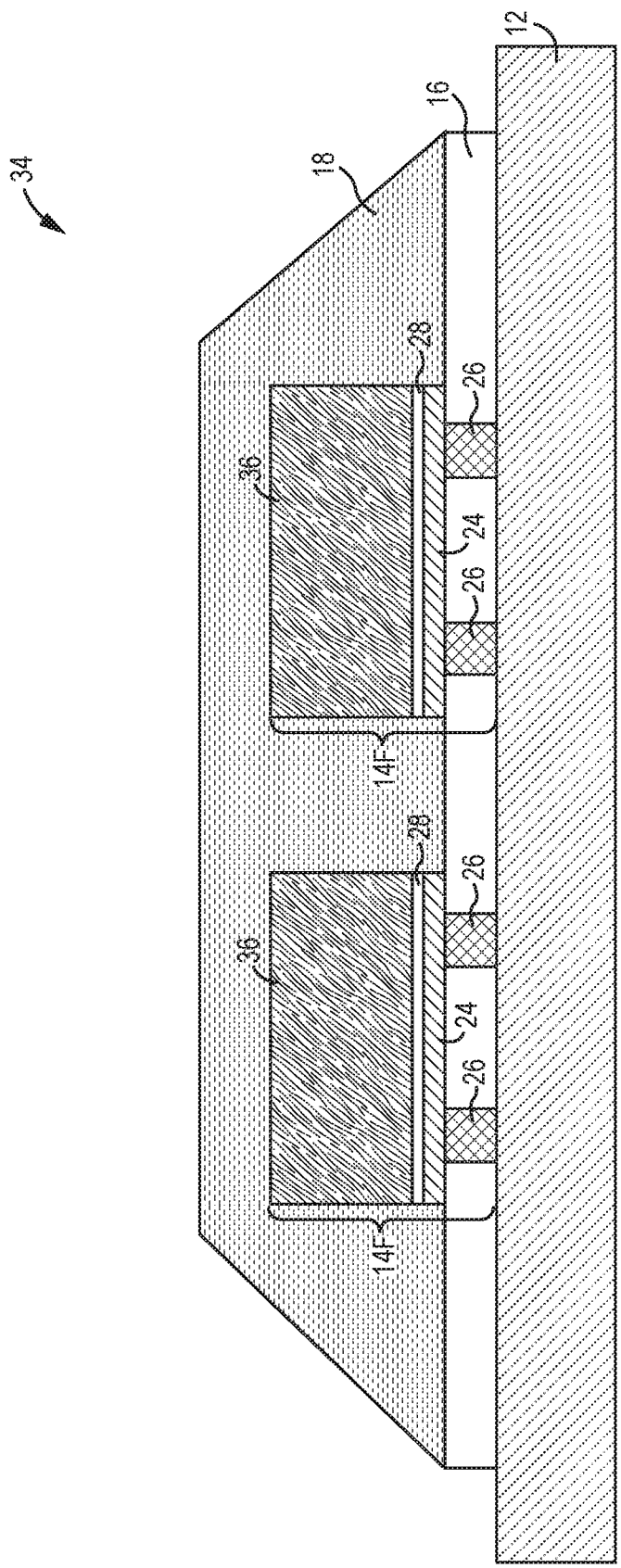

Initially, a semiconductor package 34 is provided as depicted in FIG. 4. For the purpose of this illustration, the semiconductor package 34 includes the module substrate 12, two flip chip die 14F, the underfilling layer 16, and the mold compound component 18. In different applications, the semiconductor package 34 may include fewer or more flip chip dies. In detail, each flip chip die 14F includes the device layer 24, the interconnects 26 extending from the lower surface of the device layer 24 and coupled to the upper surface of the module substrate 12, the dielectric layer 28 over the upper surface of the device layer 24, and a silicon handle layer 36 over the dielectric layer 28. As such, the backside of the silicon handle layer 36 is a top surface of each flip chip die 14F.

In one embodiment, each flip chip die 14F may be formed from a SOI structure, which refers to a structure including a silicon handle layer, a silicon epitaxy layer, and a buried oxide layer sandwiched between the silicon handle layer and the silicon epitaxy layer. Herein, the device layer 24 of each flip chip die 14F is formed by integrating electronic components in or on the silicon epitaxy layer of a SOI structure. The dielectric layer 28 of each flip chip die 14F is the buried oxide layer of the SOI structure. The silicon handle layer 36 of each flip chip die 14F is the silicon handle layer of the SOI structure.

In addition, the underfilling layer 16 resides over the upper surface of the module substrate 12, such that the underfilling layer 16 encapsulates the interconnects 24 and underfills each flip chip die 14F between the lower surface of the device layer 22 and the upper surface of the module substrate 12. The mold compound component 18 resides over the underfilling layer 16 and encapsulates the flip chip dies 14F. The mold compound component 18 may be used as an etchant barrier to protect the flip chip dies 14F against etching chemistries such as Tetramethylammonium hydroxide (TMAH), potassium hydroxide (KOH), sodium hydroxide (NaOH), and acetylcholine (ACH) in the following steps.

Figure 5:
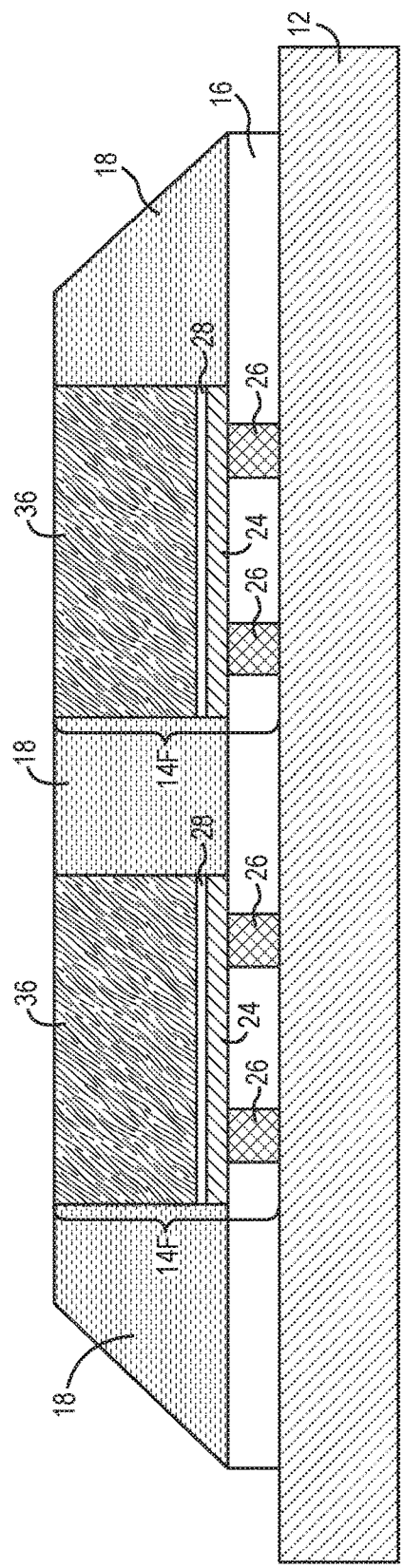
Figure 6:
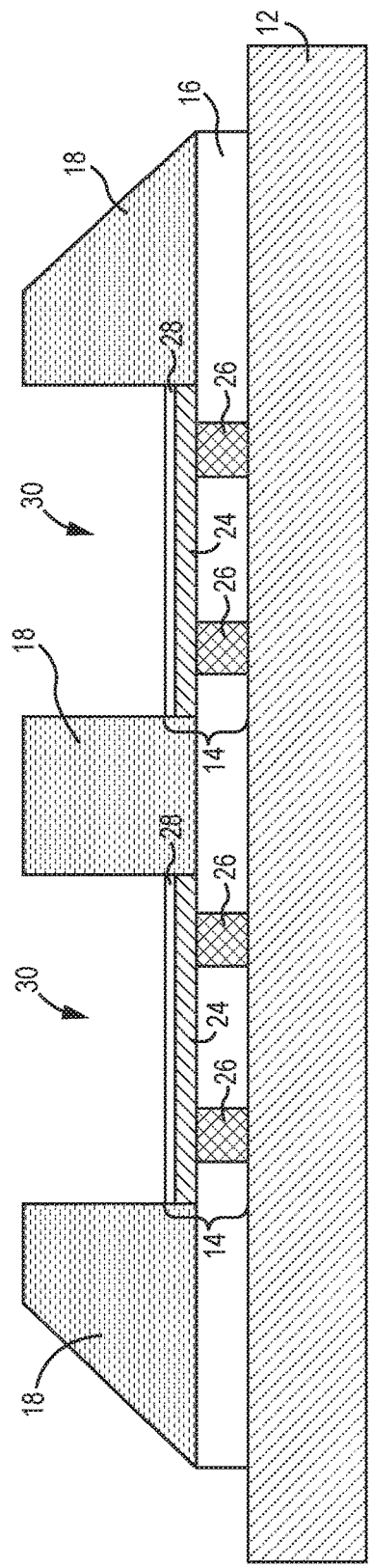

Next, the mold compound component 18 is thinned down to expose the backside of the silicon handle layer 36 of each flip chip die 14F, as shown in FIG. 5. The thinning procedure may be done with a mechanical grinding process. The following step is to remove substantially the entire silicon handle layer 36 of each flip chip die 14F to create the cavity 30 and provide the thinned flip chip die 14 with the upper surface exposed to the cavity 30, as shown in FIG. 6. Herein, removing substantially the entire silicon handle layer 36 refers to removing at least 95% of the entire silicon handle layer 36, and perhaps a portion of the dielectric layer 28. Because the silicon handle layer 36 is removed substantially, deleterious harmonic generations and intermodulation distortions at an interface between the silicon handle layer 36 and the dielectric layer 28 may be eliminated. Removing substantially the entire silicon handle layer 36 may be provided by an etching process with a wet/dry etchant chemistry, which may be TMAH, KOH, ACH, NaOH, or the like.

Figure 7:
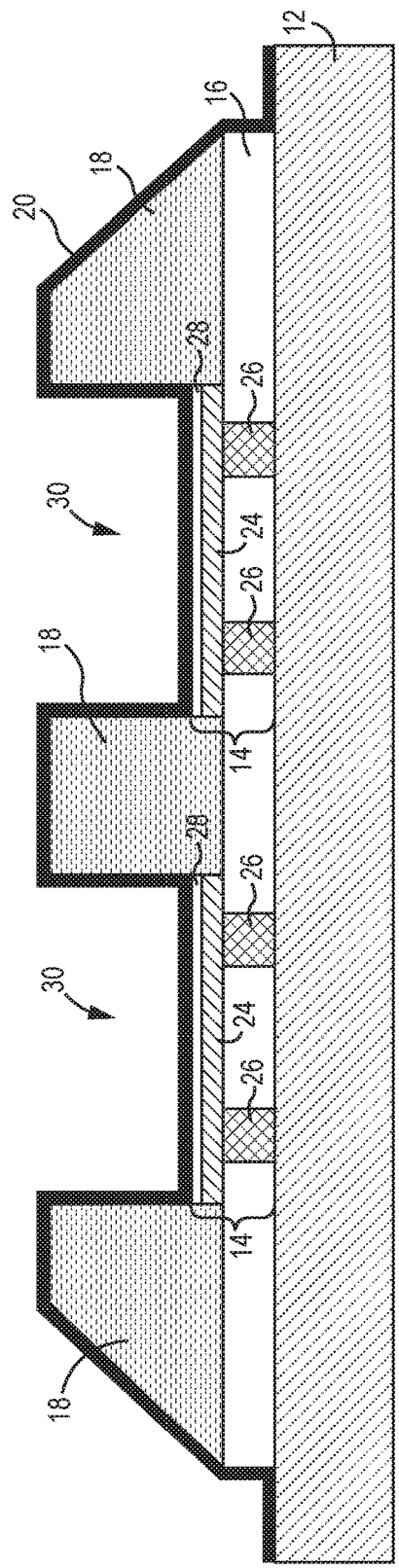

The thermally conductive film 20 is then deposited over the exposed surfaces of each cavity 30 and over the mold compound component 18 as illustrated in FIG. 7. The thermally conductive film 20 may also extend to thermally connect the module substrate 12. In each cavity 30, the thermally conductive film 20 is immediately above the upper surface of each thinned flip chip die 14 with no significant voids or defects. Depositing the thermally conductive film 20 may be provided by Chemical Vapor Deposition (CVD) or Atomic Layer Deposition (ALD) with a temperature between 150° C. and 300° C. According to different depositing processes with different materials, a protecting procedure to a lower surface of the module substrate 12, which contains the electrical input/output contact regions, may be applied before the deposition (not shown).

Figure 8:
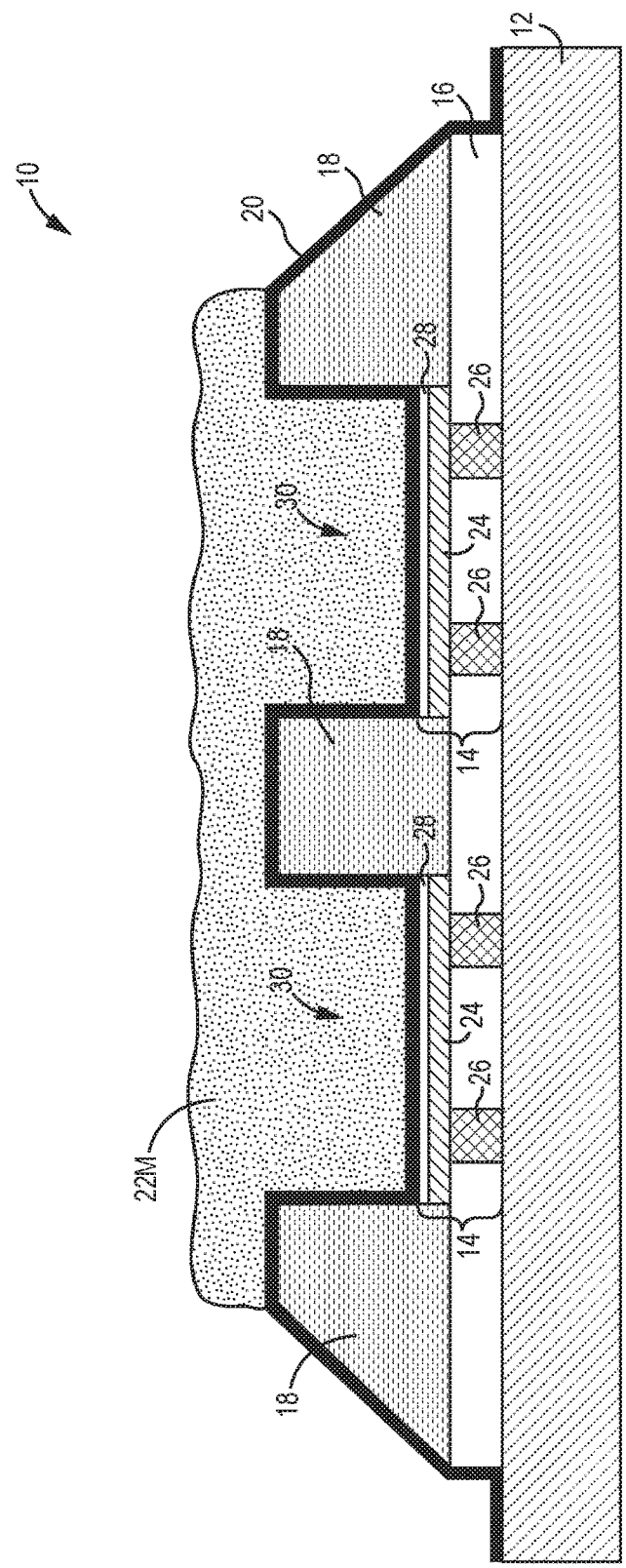

After the thermally conductive film 20 is deposited over the exposed surfaces of each cavity 30 and over the mold compound component 18, a thermally enhanced mold compound 22M is applied over at least a portion of the thermally conductive film 20 to substantially fill each cavity 30 as depicted in FIG. 8. Notice that the thermally enhanced mold compound 22M does not directly reside over the upper surface of the thinned flip chip dies 14. In some cases, the thermally enhanced mold compound 22M may further reside over the mold compound component 18. A curing process (not shown) is followed to harden the thermally enhanced mold compound 22M in order to form the thermally enhanced mold compound component 22. The curing temperature is between 100° C. and 320° C. depending on which material is used as the thermally enhanced mold compound 22M. Normally, the thermally conductive film 20 has a higher thermal conductivity than the thermally enhanced mold compound component 22, such that the bottom region of each cavity 30 (adjacent to the upper surface of each thinned flip chip die 14) has better heat dissipation performance than the rest of the cavity 30.

Figure 9:
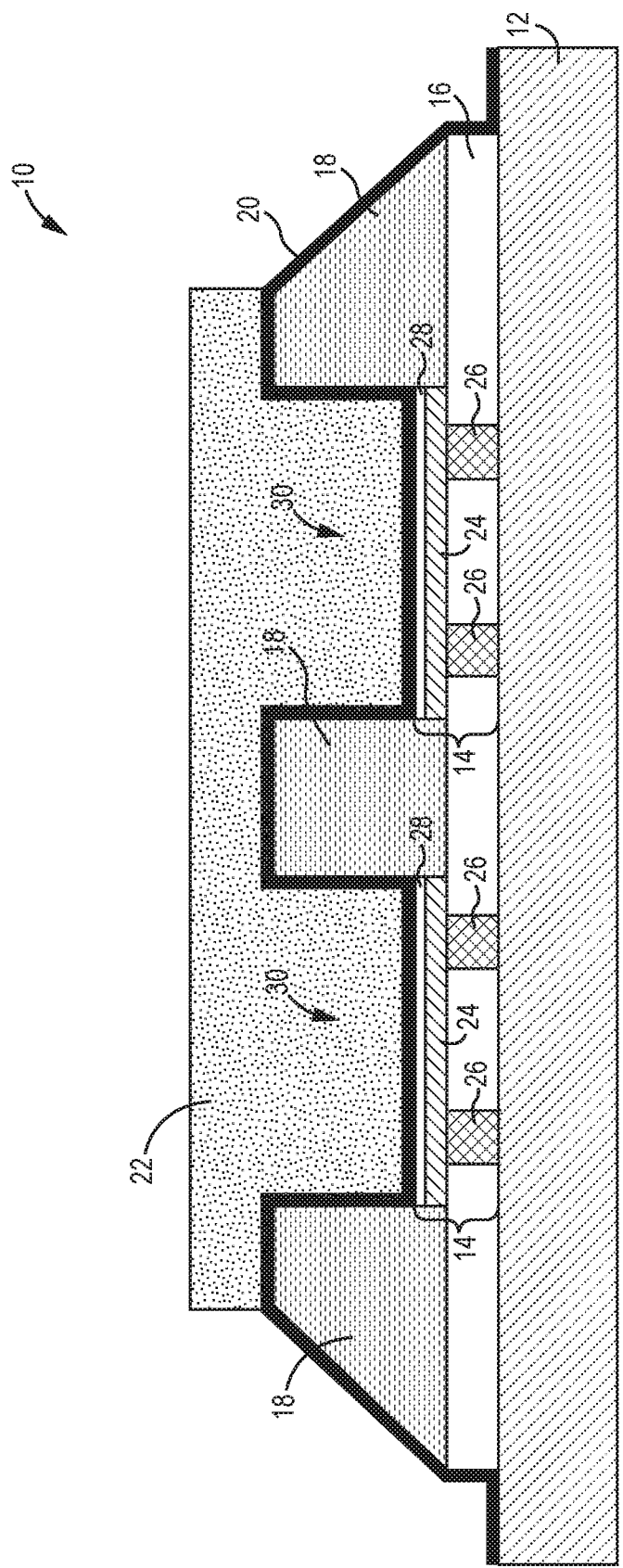

An upper surface of the thermally enhanced mold compound component 22 is then planarized to form the thermally enhanced semiconductor package 10 as depicted in FIG. 9. A mechanical grinding process may be used for planarization. The thermally enhanced mold compound component 20 may reside over the mold compound component 18. Finally, the thermally enhanced semiconductor package 10 may be marked, diced, and singulated into individual components.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a module substrate having an upper surface;
   a thinned flip chip die comprising:
      a device layer comprising electronic components;
      a dielectric layer over an upper surface of the device layer; and
      a plurality of interconnects extending from a lower surface of the device layer and coupled to the upper surface of the module substrate;
   a mold compound component residing over the upper surface of the module substrate, surrounding the thinned flip chip die, and extending above an upper surface of the thinned flip chip die to form a cavity over the upper surface of the thinned flip chip die, wherein the mold compound component is not over the thinned flip chip die;
   a thermally conductive film residing over at least the upper surface of the thinned flip chip die at a bottom of the cavity; and
   a thermally enhanced mold compound component residing over at least a portion of the thermally conductive film to fill the cavity.

2. The apparatus of claim 1, wherein the thinned flip chip die is formed from a silicon on insulator (SOI) structure, wherein the device layer of the thinned flip chip die is formed from a silicon epitaxy layer of the SOI structure, and the dielectric layer of the thinned flip chip die is a buried oxide layer of the SOI structure.

3. The apparatus of claim 1 wherein the thermally conductive film has a higher thermal conductivity than the thermally enhanced mold compound component.

4. The apparatus of claim 1 wherein the thermally conductive film has a thermal conductivity between 5 w/m·k and 5000 w/m·k.

5. The apparatus of claim 1 wherein the thermally conductive film has a thickness between 0.1 μm to 100 μm.

6. The apparatus of claim 1 wherein the thermally conductive film is formed from chemical vapor deposition (CVD) diamond.

7. The apparatus of claim 6 wherein the thermally conductive film has a thickness greater than 1 μm.

8. The apparatus of claim 1 wherein the thermally conductive film is formed from boron nitride.

9. The apparatus of claim 8 wherein the thermally conductive film has a thickness between 5 μm and 10 μm.

10. The apparatus of claim 1 wherein the thermally conductive film is formed from one of a group consisting of aluminum nitride, alumina, and beryllium oxide.

11. The apparatus of claim 1 wherein the thermally enhanced mold compound component has a thermal conductivity between 2 w/m·k and 20 w/m·k.

12. The apparatus of claim 1 wherein the thermally conductive film resides over exposed surfaces of the cavity and over the mold compound component to thermally connect the module substrate.

13. The apparatus of claim 1 wherein the thermally enhanced mold compound component resides over an entirety of the thermally conductive film.

14. The apparatus of claim 13 further comprises a shielding structure that encapsulates the thermally enhanced mold compound component and is in contact with the module substrate.

15. The apparatus of claim 1 further comprising an underfilling layer residing between the mold compound component and the upper surface of the module substrate, and underfilling the thinned flip chip die between the lower surface of the device layer and the upper surface of the module substrate.

16. The apparatus of claim 15 wherein the underfilling layer is formed from a same material as the mold compound component.

* * * * *